United States Patent [19]

Uden

[11] Patent Number: 4,649,418
[45] Date of Patent: Mar. 10, 1987

[54] DATA CARD AND METHOD OF MANUFACTURING SAME

[75] Inventor: Edward Uden, Barmstedt, Fed. Rep. of Germany

[73] Assignee: U.S. Philips Corporation, New York, N.Y.

[21] Appl. No.: 534,999

[22] Filed: Sep. 22, 1983

[30] Foreign Application Priority Data

Sep. 27, 1982 [DE] Fed. Rep. of Germany ....... 3235650

[51] Int. Cl.⁴ .................. G06K 19/00; H01L 39/02
[52] U.S. Cl. .................. 357/80; 174/52 FP; 235/487; 357/74
[58] Field of Search .................. 357/74, 75, 80; 174/15 HS, 52 FP; 235/488, 492, 487

[56] References Cited

U.S. PATENT DOCUMENTS

| | | | |
|---|---|---|---|
| 3,637,994 | 1/1972 | Ellingboe | 357/72 |
| 3,885,304 | 5/1975 | Kaiser et al. | 357/72 |
| 4,004,133 | 1/1977 | Hannan et al. | 357/72 |
| 4,086,696 | 5/1978 | Ikuta | 357/72 |
| 4,086,752 | 5/1978 | Kishimoto | 357/72 |
| 4,143,508 | 3/1979 | Ohno | 357/72 |
| 4,218,701 | 8/1980 | Shirasaki | 357/72 |
| 4,222,516 | 9/1980 | Badet et al. | 357/72 |
| 4,264,917 | 4/1981 | Ugon | 357/72 |
| 4,460,825 | 7/1984 | Haghiri-Tehrani et al. | 357/74 |
| 4,483,067 | 11/1984 | Parmentier | 29/890 |

Primary Examiner—William L. Sikes
Assistant Examiner—Frank González
Attorney, Agent, or Firm—Norman N. Spain

[57] ABSTRACT

A data card having a lower covering film (2), a card body (3) and an upper covering foil (1), in which the card body (3) a carrier body (4) is present which is provided on one or both sides with conductor tracks (11, 12) and carries a semiconductor chip (5). In order to be able to contact the semiconductor chip (5) by means of conventional wire connections (7) and nevertheless not to exceed a thickness of 0.76 mm for the card, the carrier body (4) has the form of a film which is provided with a perforation (10) and in which the semiconductor chip (5) is disposed in the perforation (10) and is surrounded on the upper side of the carrier body (4) by a frame (8) and is covered with a covering mass (9). In the manufacture of such a card, the carrier body (4) provided with a perforation (10) is first covered on its lower side with a preferably self-adhering film (6), to which the semiconductor chip (5) is then adhered, while this film (6) is removed after the frame (8) and the covering mass (9) have been provided.

10 Claims, 2 Drawing Figures

DATA CARD AND METHOD OF MANUFACTURING SAME

BACKGROUND OF THE INVENTION

1. Field of the Invention

The invention relates to a data card comprising a lower covering film, an upper covering film and a card body in between said covering films, in which card body at least one semiconductor element is present connected to a carrier body provided on one or both sides with electrical conductor tracks.

2. Description of the Prior Art

A data card of this kind is known from German patent application publication 29 20 012. In this known card, a covering film serves as a carrier body for the semiconductor element and the latter is secured by means of a direct-contacting technique (flip-chip technique) on the conductor tracks on this carrier body. Such direct contacts are less reliable, however. If, instead, use is made of the wire connections usual for contacting semiconductor chips, due to the space required therefor it has not been possible hitherto to obtain a data card with the internationally standardized thickness of 0.76 mm.

SUMMARY OF THE INVENTION

Therefore, the invention has for its object to construct a data card of the kind mentioned in the opening paragraph so that the connections between the semiconductor chip or chips in the card and the associated conductor tracks can be obtained by means of the wire connection technique which has been tested and has proved satisfactory, and nevertheless the thickness of the card does not exceed the standardized value of about 0.76 mm.

According to the invention, this is achieved in a card in which (a) the carrier body is a film which carries conductor tracks at one or both surfaces and which is provided with at least one, in which is arranged a semiconductor element constituted by a semiconductor chip, (b) the contacting surfaces of the semiconductor chip are connected through wire connections to the conductor tracks on the carrier body, (c) the carrier body carries on the side connected to the wire connections a frame which surrounds the semiconductor chip and the wire connections and has a height such that the distance of the lower side of the carrier body to the upper side of the frame is substantially equal to the thickness of the card body, (d) the space inside the frame is filled up to the surface limited by its upper side with a covering mass enclosing the seimconductor chip and the wire connections.

A data card thus constructed has the advantage that it can be manufactured with the use of tested connection techniques, is resistant to heavy loads and destruction of the wire connections between semiconductor chips and conductor tracks and does not exceed the standardized thickness.

Further embodiments of the invention are apparent from the subclaims.

Preferably, the part of the lower surface of the carrier body constituted by the perforation is covered with an auxiliary foil supporting the semiconductfor chip.

The frame is perferably in the form of a ring consisting of glass epoxy or PVC polyvinyl chloride and is filled with a covering mass of epoxy resin or silicon rubber. An efficient method of manufacturing a data card according to the invention, is characterized in that the carrier body is first covered on its lower side with a film, after which the semiconductor chip is adhered to the foil in the perforation of the carrier body, the wire connections between the semiconductor chip and the conductor tracks are formed on the carrier body, the frame is provided and the space inside this frame is filled with the covering mass after which the foil is removed from the lower surface of the carrier body. The foil is perferably self- adhering.

BRIEF DESCRIPTION OF THE DRAWINGS

An embodiment of the invention will now be described more fully with reference to the accompanying drawing, in which.

The Figures are not drawn to scale, but are only schematic and the vertical dimensions are greatly exaggerated.

DESCRIPTION OF THE PREFERRED EMBODIMENT

The data card may comprise several semiconductor chips. A separate perforation is then provided in the carrier body for each of these chips and each chip and its wire connections are surrounded by a separate frame and enveloped by a separate covering mass.

For the sake of clarity only one semiconductor chip 5 is shown in the Figures.

Figure 1:
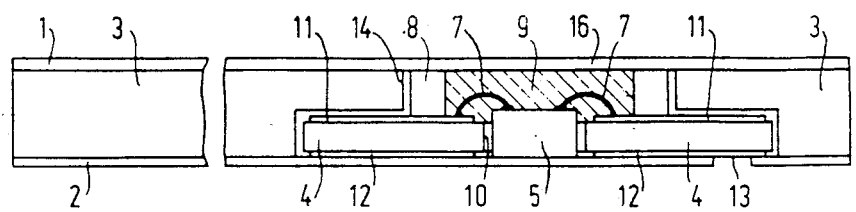
FIG. 1 is a cross-sectional view of a data card.
Figure 2:
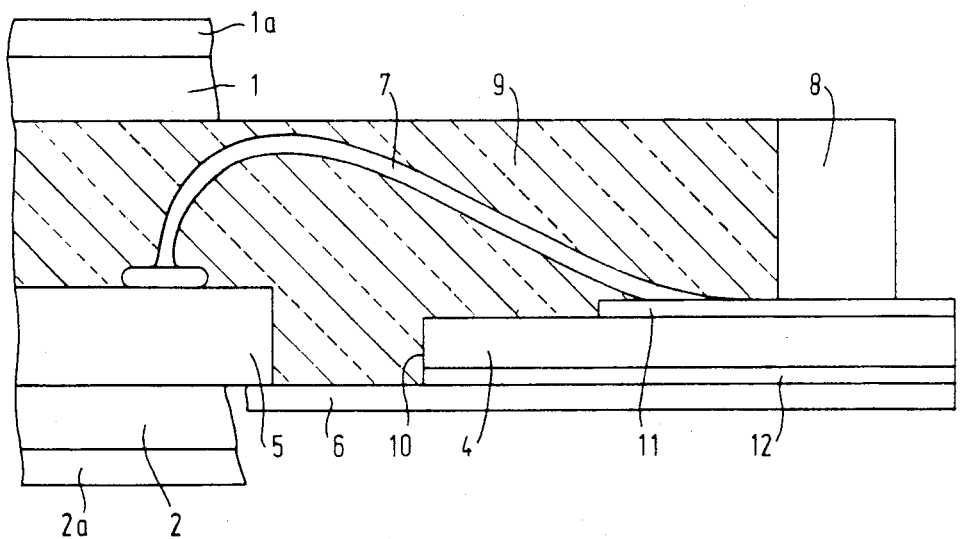
FIG. 2 shows a detail of the cross-section of FIG. 1.

FIG. 1 is a cross-sectional view of a data card according to the invention, which mainly consists of a card body 3, which is covered by an upper covering film 1 and a lower covering film 2. The card body 3 then has a recess 14 for a carrier body 4. The carrier body 4 is provided with a perforation 10, into which a semiconductor chip 5 is inserted so that the lower surface of the semiconductor chip is co-planar with the lower surface of the carrier body 4. The carrier body 4 carries both on its upper and on its lower side conductor tracks 11 and 12 which are connected to each other in a suitable manner and which are connected to contact surfaces 13, which are accessible through openings in the lower covering foil 2 of the data card to permit of contacting the semiconductor chips contained in the card.

The contacting surfaces of the semiconductor chip 5 are connected by means of wire connections 7 obtained, for example, by an ultrasonic bond method to the conductor tracks 11 on the upper side of the carrier body 4. The form of the arc of the connection wires 7 is so flat that the highest point of these wires still remains below the upper surface of the covering mass 9.

In order to ensure that the semiconductgor chip 5 in the preforation 10 of the carrier body and the wire connections 7 are held in a reliable manner, the semiconductor chip 5 and the wire connections 7 are surrounded on the upper surface of the carrier body 4 by an annular frame 8 whose height is chosen so that the thickness of the whole card determined by its height and the thickness of the covering foils 1 and 2 does not exceed the said value of about 0.76 mm. The space formed inside the frame 8 is filled with a covering mass 9 of epoxy resin or silicon rubber.

If one of the semiconductor chips 5 is a memory chip, whose stored data can be erased by irradiation with, for example, UV light, the upper covering film 1 is provided with a suitable window 16. The two covering films 1 and 2 may be in bipartite from, in which event the lower part 1 or 2 may carry an imprint etc., which is then protected by the upper part 1a and 2a, respectively. A data card thus constructed is preferably manufactured as follows:

A carrier body 4 constituted by a piece of film of epoxy resin reinforced with glass fiber and having a thickness of 0.1 mm is first provided on both sides with conductor tracks 11, 12 and contact surfaces 13 of gold. Subsequently, a perforation 10 for the semiconductor chip 5 is punched into this carrier body. The back side of this carrier body 4 is then provided with a self-adhering film 6 and the semiconductor chip 5 is adhered in the perforation 10 in the carrier body 4 to this self-adhering foil 6. Subsequently, the wire connections 7 between the contact surfaces on the semiconductor chips 5 and the conductor tracks 11 on the upper side of the carrier body 4 are obtained by means of an ultrasonic wire bonder frequently used in the manufacture of semiconductor chips. It is then ensured that the arc of the wire connections 7 has a form which is as flat as possible. Subsequently, a punched-out ring (frame) 8 likewise consisting of epoxy resin reinforced with glass fiber and having a height of about 0.4 mm is adhered to the carrier body 4 in such a manner that it surrounds the semiconductor chip 5 and the wire connections 7.

The space over the semiconductor chip 5 and the wire connections 7 enclosed by the annular frame 8 is then filled with a covering mass 9 of epoxy resin filled with SiO2 and this covering mass is then cured by a heat treatment. Subsequently, the upper side of the frame 8 and of the covering mass 9 is ground to such an extent that the distance between the lower side of the carrier body 4 and the upper side of the frame 8 is about 0.44 mm.

Finally, the self-adhering foil 6, which has carried hitherto the semiconductor chip 5, is torn off and the assembly comprising the carrier body 4 and the semiconductor chip 5 is inserted into the recess 14 of the card body 3 of PVC (see FIG. 1) and both parts are compressed between an upper covering film 1 and a lower covering film 2, which likewise consist of PVC, under pressure and at elevated temperature, and, while maintaining the pressure, then cooled in such a manner that the finished data card has the standardized thickness of 0.76 mm. The lower covering film 2 is provided above the contact surfaces 13 on the lower side of the carrier body 4 with openings.

What is claimed is:

1. A data card comprising a lower covering film, an upper covering film and a card body positioned between said covering films, in which card body at least one semiconductor element is present and is connected to a carrier body which carrier body is provided on one or both surfaces thereof conductor tracks, characterized in that:
    (a) the carrier body (4) is a film which carries electric conductor tracks (11, 12) at one or both surfaces thereof and which carrier body is provided with at least one perforation (10) extending from the upper to the lower surface of said carrier body, in which perforation there is arranged a semiconductor element consituted by a semiconductor chip (5);
    (b) at least one surface of the semiconductor chip (5) is connected through wire connections (7) to the conductor tracks (11) on a surface of the carrier body (4);
    (c) the carrier body (4) carries on the surface thereof connected to the wire connections (7) a frame (8) having an upper side opening which surrounds the semiconductor chip and the wire connections and has a height such that the distance of the lower surface of the carrier body (4) to the upper side opening of the frame (8) is substantially equal to the thickness of the card body (3) and
    (d) the space inside the frame (8) is filled up to its upper side opening with a covering mass (9) enclosing the semiconductor chip (5) and the wire connections (7).

2. A data card is claimed in claim 1, characterized in that at the lower surface of the carrier body (4) the perforation (10) is covered by an auxiliary film (6) supporting the semiconductor chip (5).

3. A data card as claimed in claim 1, characterized in that the frame (8) is in the form of a ring.

4. A data card as claimed in claim 1, characterized in that the upper covering film (1) is provided with a radiation-transparent part (16) opposite to the semiconductor chip (5).

5. A data card as claimed in claim 1, characterized in that its thickness is about 0.76 mm.

6. A data card as claimed in claim 1 characterized in that the carrier body (4) consists of a material selected from the group consisting of glass reinforced epoxy and polyvinyl chloride.

7. A data card as claimed in claim 1 characterized in that the frame (8) consists of a material selected from the group consisting of glass reinforced epoxy and polyvinyl chloride.

8. A data card of claim 1 characterized in that the covering mass (9) consists of a material selected from the group consisting of epoxy resin and silicon rubber.

9. A method of manufacturing a data card comprising the steps:
    (a) providing a carrier body (4), constituted by a film, with electric conductor tracks (11) on the upper and the lower surface thereof;
    (b) forming a preforation (10) in said carrier body (4), extending from the upper to the lower surface thereof;
    (c) causing a film (6) to adhere to said lower surface;
    (d) inserting a semiconductor chip (5) in said perforation (10) in said carrier body (4) while causing said semiconductor chip (5) to adhere to said film (6);
    (e) forming wire connections (7) between said semiconductor chip (5) and said conductor tracks (11);
    (f) positioning a frame (8) on the surface of said carrier body (4) bearing the conductor tracks (11) joined to said wireconnections (7) in a manner such that said frame (8) surrounds said semiconductor chip (5) and said wire connectors (7) and adheres to said carrier body (4);
    (g) filling said frame (8) with a curable covering mass (9);
    (h) curing said covering mass (9); and
    (i) removing said film (6) from said lower surface.

10. A method as claimed in claim 9, characterized in that film (6) is a self-adhering film.

* * * * *